(12) United States Patent
Jeon et al.

(10) Patent No.: US 10,777,133 B2
(45) Date of Patent: Sep. 15, 2020

(54) ORGANIC LIGHT EMITTING DIODE DISPLAY

(71) Applicant: Samsung Display Co., Ltd., Yongin-si (KR)

(72) Inventors: Sang Jin Jeon, Hwaseong-si (KR); Sang-Uk Lim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 91 days.

(21) Appl. No.: 15/805,992

(22) Filed: Nov. 7, 2017

(65) Prior Publication Data
US 2018/0144684 A1    May 24, 2018

(30) Foreign Application Priority Data
Nov. 18, 2016   (KR) .................... 10-2016-0153902

(51) Int. Cl.
G09G 3/3258    (2016.01)
G09G 3/3233    (2016.01)
G09G 3/3266    (2016.01)
G09G 3/3283    (2016.01)
H01L 27/32     (2006.01)
(Continued)

(52) U.S. Cl.
CPC ......... *G09G 3/3233* (2013.01); *G09G 3/3266* (2013.01); *G09G 3/3283* (2013.01); *H01L 27/3262* (2013.01); *H01L 27/3265* (2013.01); *H01L 27/3276* (2013.01); *G09G 2300/043* (2013.01); *G09G 2300/0417* (2013.01); *G09G 2300/0819* (2013.01); *G09G 2300/0842* (2013.01); *G09G 2300/0861* (2013.01); *G09G 2310/0262* (2013.01); *G09G 2320/0238* (2013.01); *G09G 2330/023* (2013.01);
(Continued)

(58) Field of Classification Search
CPC ............... G09G 3/3208; G09G 3/3233; G09G 2320/043; G09G 2320/045; G09G 3/30
See application file for complete search history.

(56) References Cited

U.S. PATENT DOCUMENTS 9,355,741 B2    5/2016  Jeon et al.
2008/0218497 A1*  9/2008  Takahashi ............ G09G 3/3233
                                                345/204

(Continued)

FOREIGN PATENT DOCUMENTS

KR    1020140045150    4/2014
KR    101458911        10/2014

*Primary Examiner* — Yuzhen Shen
(74) *Attorney, Agent, or Firm* — Cantor Colburn LLP

(57) ABSTRACT

An OLED display device includes a pixel having a switching transistor turned on by a scan signal received from a scan line and which transmits a data signal received from a data line to a first node, a driving transistor connected between the first node and a second node and through which a driving current corresponding to the data signal flows, a storage capacitor including one end connected to a power supply and another end connected to a gate electrode of the driving transistor, an OLED emitting light by the driving current, and a light emission control transistor connected between the second node and an anode of the OLED and which is turned on by an light emission control signal and transmits the driving current to the OLED. The switching transistor may be an n-type transistor, and the light emission control transistor is a p-type transistor.

15 Claims, 6 Drawing Sheets

(51) Int. Cl.
  *H01L 27/12* (2006.01)
  *H01L 29/786* (2006.01)

(52) U.S. Cl.
  CPC ...... *H01L 27/1225* (2013.01); *H01L 29/7869* (2013.01); *H01L 29/78672* (2013.01)

(56) References Cited

U.S. PATENT DOCUMENTS

| | | | |
|---|---|---|---|
| 2010/0194716 A1* | 8/2010 | Park | G09G 3/3233 345/204 |
| 2017/0365213 A1* | 12/2017 | Rieutort-Louis | G09G 3/3233 |
| 2018/0005569 A1* | 1/2018 | Li | G09G 3/3233 |
| 2018/0061311 A1* | 3/2018 | Lin | G09G 3/32 |

* cited by examiner

ORGANIC LIGHT EMITTING DIODE DISPLAY

This application claims priority to Korean Patent Application No. 10-2016-0153902, filed on Nov. 18, 2016, and all the benefits accruing therefrom under 35 U.S.C. § 119, the content of which in its entirety is herein incorporated by reference.

BACKGROUND

(a) Field

Exemplary embodiments of the invention relate to an organic light emitting diode display device.

(b) Description of the Related Art

An organic light emitting diode display device uses an organic light emitting diode ("OLED") of which luminance is controlled by a current or a voltage. In general, the organic light emitting diode display device is classified into a passive matrix OLED ("PMOLED") and an active matrix OLED ("AMOLED") according to a driving mode of the OLED. Among the OLEDs, the AMOLED, which emits light selected for each unit pixel in terms of resolution, contrast, and operation speed, has become popular.

A pixel of the AMOLED includes an organic light emitting diode and a circuit portion for supplying a current to the organic light emitting diode.

Transistors included in the conventional circuit portion are those having a low-temperature polycrystalline silicon ("LTPS") semiconductor layer. The LTPS transistor consumes a high amount of power due to a high turn-off current. That is, the LTPS transistor is turned off by a large amount of current.

A transistor including an oxide semiconductor having a low turn-off current has been researched to be used as a semiconductor layer so that the transistor included in the circuit portion may operate at low power.

SUMMARY

Exemplary embodiments of the invention are directed to an organic light emitting diode display device that may operate at low power.

In addition, Exemplary embodiments of the invention are directed to an organic light emitting diode display device that may prevent luminance of a black image from increasing.

According to an exemplary embodiment of the invention, an organic light emitting diode display device includes a plurality of pixels, a plurality of scan lines connected to the plurality of pixels and which transmits corresponding scan signals to the plurality of pixels, a plurality of initialization lines connected to the plurality of pixels and which transmits corresponding initialization signals to the plurality of pixels, a plurality of light emission control lines connected to the plurality of pixels and which transmits corresponding light emission control signals to the plurality of pixels, and a plurality of data lines connected to the plurality of pixels and which transmits corresponding data signals to the plurality of pixels, where at least one of the plurality of pixels includes a switching transistor turned on by a scan signal received from a corresponding one of the plurality of scan lines and which transmits a data signal received from a corresponding one of the plurality of data lines to a first node, a driving transistor connected between the first node and a second node and through which a driving current corresponding to the data signal flows, a storage capacitor which includes a first end connected to a power supply and a second end connected to a gate electrode of the driving transistor, an organic light emitting diode which emits light based on the driving current, the driving current flows through the organic light emitting diode, and a light emission control transistor connected between the second node and an anode of the organic light emitting diode and which is turned on by an light emission control signal received from a corresponding one of the plurality of light emission control lines and which transmits the driving current to the organic light emitting diode, and the switching transistor may be an n-type transistor, and the light emission control transistor is a p-type transistor.

In an exemplary embodiment, the light emission control transistor may be a low-temperature polycrystalline silicon ("LTPS") semiconductor transistor, and the switching transistor may be an oxide semiconductor transistor.

In an exemplary embodiment, the organic light emitting diode display device may further include a compensation transistor which compensates a threshold voltage of the driving transistor and is connected to the driving transistor.

In an exemplary embodiment, the organic light emitting diode display device may further include an initialization transistor turned on by an initialization signal received from a corresponding one of the plurality of initialization lines and which applies an initialization voltage to the gate electrode of the driving transistor.

In an exemplary embodiment, the organic light emitting diode display device may further include a reset transistor turned on by the scan signal and which applies the initialization voltage to the anode of the organic light emitting diode.

In an exemplary embodiment, the compensation transistor, the initialization transistor, and the reset transistor may be n-type transistors.

In an exemplary embodiment, the compensation transistor, the initialization transistor, and the reset transistor may be oxide semiconductor transistors.

In an exemplary embodiment, the organic light emitting diode display device may further include an operation control transistor turned on by the light emission control signal and which connects the first node and the power supply.

In an exemplary embodiment, the operation control transistor may be a p-type transistor.

In an exemplary embodiment, the operation control transistor may be an n-type transistor.

According to another exemplary embodiment of the invention, an organic light emitting diode display device includes a plurality of pixels, a plurality of scan lines connected to the plurality of pixels and which transmits corresponding scan signals to the plurality of pixels, a plurality of initialization lines connected to the plurality of pixels and which transmits corresponding initialization signals to the plurality of pixels, a plurality of light emission control lines connected to the plurality of pixels and which transmits corresponding light emission control signals to the plurality of pixels, and a plurality of data lines connected to the plurality of pixels and which transmits corresponding data signals to the plurality of pixels, where at least one of the plurality of pixels includes a switching transistor turned on by a scan signal received from a corresponding one of the plurality of scan lines and which transmits a data signal received from a corresponding one of the plurality of data lines to a first node, a driving transistor connected between the first node and a second node and through which a driving current corresponding to the data signal flows, a storage capacitor which includes a first end connected to a power supply and a second end connected to a gate electrode of the driving transistor, an organic light emitting diode which emits light by the driving current, where the driving current flows through the organic light emitting diode, and a light emission control transistor connected between the second node and an anode of the organic light emitting diode and which is turned on by an light emission control signal received from a corresponding one of the plurality of light emission control lines and which transmits the driving current to the organic light emitting diode, and the at least one of the plurality of pixels may include both an n-type transistor provided with an oxide semiconductor layer and a p-type transistor provided with an LTPS semiconductor layer.

In an exemplary embodiment, the switching transistor may be the n-type transistor provided with the oxide semiconductor layer, and the driving transistor and the light emission control transistor may be the p-type transistors provided with the LTPS semiconductor layer.

In an exemplary embodiment, the organic light emitting diode display device may further include a compensation transistor which compensates a threshold voltage of the driving transistor and is connected to the driving transistor, an initialization transistor turned on by an initialization signal received from a corresponding one of the plurality of initialization lines and which applies an initialization voltage to the gate electrode of the driving transistor, and a reset transistor turned on by the scan signal and which applies the initialization voltage to the anode of the organic light emitting diode.

In an exemplary embodiment, the compensation transistor, the initialization transistor, and the reset transistor may be the n-type transistors provided with the oxide semiconductor layer.

In an exemplary embodiment, the organic light emitting diode display device may further include an operation control transistor turned on by the light emission control and which connects the first node and the power supply.

In an exemplary embodiment, the operation control transistor may be the p-type transistor provided with the LTPS semiconductor layer.

In an exemplary embodiment, the operation control transistor may be the n-type transistor provided with the oxide semiconductor layer.

According to exemplary embodiments of the invention, it is possible to reduce power consumption of an organic light emitting diode display devices.

According to exemplary embodiments of the invention, it is possible to improve display quality of an organic light emitting diode display device.

DETAILED DESCRIPTION

Figure 1:
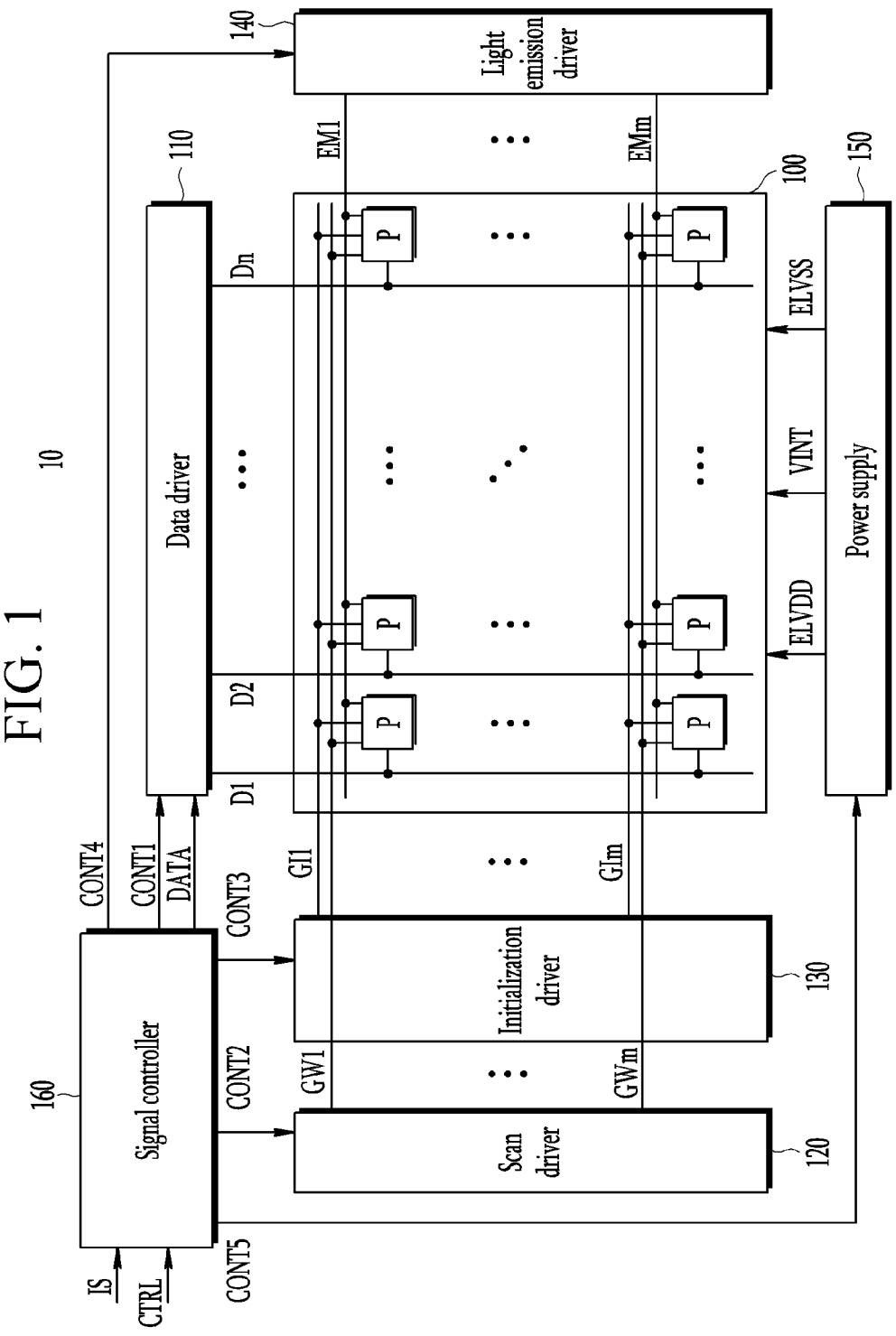
FIG. 1 illustrates a block diagram of an exemplary embodiment of an organic light emitting diode display device.

The invention will be described more fully hereinafter with reference to the accompanying drawings, in which exemplary embodiments are shown. As those skilled in the art would realize, the described embodiments may be modified in various different ways, all without departing from the spirit or scope of the present invention.

To clearly describe exemplary embodiments of the invention, portions which do not relate to the description are omitted, and like reference numerals designate like elements throughout the specification.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an."

In addition, unless explicitly described to the contrary, the word "comprise" and variations such as "comprises" or "comprising" will be understood to imply the inclusion of stated elements but not the exclusion of any other elements.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Hereinafter, an organic light emitting diode display device 10 according to an exemplary embodiment will be described with reference to FIG. 1.

FIG. 1 illustrates a schematic block diagram of an exemplary embodiment of an organic light emitting diode display device according to the invention.

The organic light emitting diode display device 10 may include a display panel 100, a data driver 110, a scan driver 120, an initialization driver 130, a light emission driver 140, a power supply 150, and a signal controller 160. The elements shown in FIG. 1 are not essential to the exemplary embodiment of the organic light emitting diode display device. Thus, the organic light emitting diode display device described in the present specification may include a larger or smaller number of elements than those described above.

The display panel 100 includes a plurality of display signal lines and a plurality of pixels P connected to the plurality of display signal lines. The plurality of display signal lines include a plurality of scan lines GW1 to GWm for transmitting a plurality of scan signals, which are also referred to as gate signals, a plurality of initialization lines GI1 to GIm for transmitting a plurality of initialization signals, a plurality of light emission control lines EM1 to EMm for transmitting a plurality of light emission control signals, and a plurality of data lines D1 to Dn for transmitting a plurality of data voltages. The plurality of pixels P may be connected to the corresponding scan lines GW1 to GWm, the corresponding initialization lines GI1 to GIm, the corresponding light emission control lines EM1 to EMm, and the corresponding data lines D1 to Dn, respectively. Each of the plurality of pixels P may include an organic light emitting element. Each of the plurality of pixels P displays an image depending on a data voltage transmitted thereto.

Each of the plurality of pixels P of the display panel 100 receives an initialization voltage VINT, a first power voltage ELVDD, and a second power voltage ELVSS from the power supply 150.

The data driver 110 is connected to the plurality of data lines D1 to Dn of the display panel 100, and applies the plurality of data voltages to the plurality of data lines D1 to Dn. Specifically, a data driver IC may generate data voltages for all gray levels using reference gamma voltages. The data driver 110 outputs the generated data voltages as data signals to the data lines D1 to Dn.

A control signal CONT1 is an operation control signal of the data driver 110, that is generated and transmitted by the signal controller 160.

The scan driver 120 is connected to the display panel 100 through the plurality of scan lines GW1 to GWm. The scan driver 120 generates the plurality of scan signals according to a control signal CONT2 and respectively transmits the generated scan signals to corresponding scan lines.

The initialization driver 130 is connected to the display panel 100 through the plurality of initialization lines GI1 to GIm. The initialization driver 130 generates the plurality of initialization signals according to a control signal CONT3 and respectively transmits them to corresponding initialization lines.

The control signals CONT2 and CONT3 are operation control signals of the scan driver 120 and the initialization driver 130, respectively, that are generated and transmitted by the signal controller 160. The control signals CONT2 and CONT3 may include different clock signals from each of scan start signals of the scan driver 120 and the initialization driver 130.

The light emission driver 140 generates the plurality of light emission control signals according to the light emission control signal CONT4. The light emission driver 140 transmits the plurality of light emission control signals to the plurality of light emission control lines EM1 to EMm, respectively.

The power supply 150 may supply the initialization voltage VINT for initializing a gate electrode of a driving transistor and an anode N1 of an organic light emitting diode included in each pixel P of the display panel 100 to a predetermined voltage and supply the first and second power voltages ELVDD and ELVSS for driving each pixel P.

The signal controller 160 receives an input image signal IS and an input control signal CTRL from the outside. The input image signal IS includes luminance information of each pixel of the display panel 100, and the luminance may be quantized into gray levels of a predetermined number, for example, 1024, 256, or 64.

The input control signal CTRL may include a vertical synchronization signal, a horizontal synchronization signal, a main clock signal, a data enable signal, etc. associated with the image provided by the input image signal IS.

The signal controller 160 generates control signals CONT1 to CONT5 and an image data signal DATA according to the input image signal IS and the input control signal CTRL.

Specifically, the signal controller 160 processes the image signal IS according to operating conditions of the display panel 100 and the data driver 110 based on the input image signal IS and the input control signal CTRL. In an exemplary embodiment, for example, the signal controller 160 may generate the image data signal DATA through image processing processes such as gamma correction and luminance compensation on the image signal IS.

The signal controller 160 generates the control signal CONT1 for controlling the operation of the data driver 110, and transmits it to the data driver 110 together with the image-processed data signal DATA. In addition, the signal controller 160 transmits the control signal CONT2 for controlling the operation of the scan driver 120 to the scan driver 120. Further, the signal controller 160 transmits the control signal CONT3 for controlling the operation of the initialization driver 130 to the initialization driver 130. Moreover, the signal controller 160 may transmit the light emission control signal CONT4 to the light emission driver 140 to drive the light emission driver 140.

The signal controller 160 may control an operation of the power supply 150. In an exemplary embodiment, for example, the signal controller 160 may transmit a power control signal CONT5 to the power supply 150 to drive the power supply 150. The power supply 150 is connected to a power line (not shown) provided in the display panel 100.

An exemplary embodiment of a pixel P of the organic light emitting diode display device 10 according to the invention will now be described in detail with reference to FIG. 2.

Figure 2:
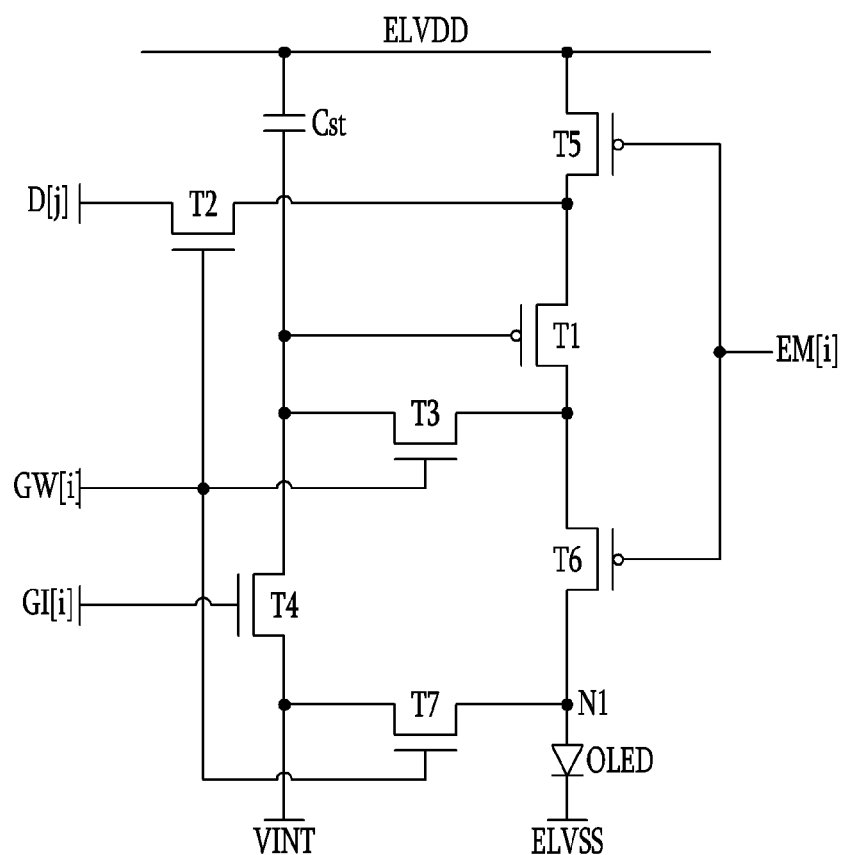
FIG. 2 illustrates a circuit diagram of an exemplary embodiment of a pixel of an organic light emitting diode display device.

FIG. 2 illustrates a circuit diagram of an exemplary embodiment of a pixel of an organic light emitting diode display device according to the invention. As shown in FIG. 2, an exemplary embodiment of one pixel of the organic light emitting diode display device 10 according to the invention may include a plurality of transistors T1 to T7, a storage capacitor Cst, and an organic light emitting diode OLED.

The plurality of transistors may include a driving transistor T1, a switching transistor T2, a compensation transistor T3, an initialization transistor T4, an operation control transistor T5, a light emission control transistor T6, and a reset transistor T7.

The signal lines connected to each pixel may include a scan line for transmitting a scan signal GW[i], an initialization line for transmitting an initialization signal GI[i] to the initialization transistor T4, a light emission control line for transmitting a light emission control signal EM[i] to the operation control transistor T5 and the light emission control transistor T6, a data line for transmitting a data signal D[j], a power line for transmitting the first power voltage ELVDD, and an initialization voltage line for transmitting the initialization voltage VINT that initializes the driving transistor T1 and the organic light emitting diode OLED.

In a pixel connected to i-th row signal lines and j-th column signal line, a gate electrode of the driving transistor T1 is connected to a first end of the storage capacitor Cst, a first electrode of the driving transistor T1 is connected to the power line for transmitting the first power voltage ELVDD via the operation control transistor T5, and a second electrode of the driving transistor T1 is electrically connected to an anode N1 of the organic light emitting diode OLED via the light emission control transistor T6. The first and second electrodes of the driving transistor T1 are different electrodes from the gate electrode of the driving transistor T1. The driving transistor T1 receives the data signal D[j] according to a switching operation of the switching transistor T2 and then supplies a driving current to the organic light emitting diode OLED via the light emission control transistor T6.

A gate electrode of the switching transistor T2 is connected to the scan line for transmitting the scan signal GW[i], a first electrode of the switching transistor T2 is connected to the data line for transmitting the data signal D[j], and a second electrode of the switching transistor T2 is connected to the power line for transmitting the first power voltage ELVDD via the operation control transistor T5 and connected to the first electrode of the driving transistor T1. The first and second electrodes of the switching transistor T2 are different electrodes from the gate electrode of the switching transistor T2.

The switching transistor T2 is turned on according to the scan signal GW[i] transmitted through the scan line and then transmits the data signal D[j] transmitted from the data line to the first electrode of the driving transistor T1, through the switching operation thereof.

A gate electrode of the compensation transistor T3 is connected to the scan line, a first electrode of the compensation transistor T3 is connected to the anode N1 of the organic light emitting diode OLED via the light emission control transistor T6 and connected to the second electrode of the driving transistor T1, and a second electrode of the compensation transistor T3 is connected to the first end of the storage capacitor Cst, a first electrode of the initialization transistor T4, and the gate electrode of the driving transistor T1. The first and second electrodes of the compensation transistor T3 are different electrodes from the gate electrode of the compensation transistor T3.

The compensation transistor T3 is turned on according to the scan signal GW[i] transmitted through the scan line and then connects the gate electrode and the second electrode of the driving transistor T1 to each other, such that the driving transistor T1 may be operated as a diode.

A gate electrode of the initialization transistor T4 is connected to the initialization line for transmitting the initialization signal GI[i], a second electrode of the initialization transistor T4 is connected to the initialization voltage line for transmitting the initialization voltage VINT, and the first electrode of the initialization transistor T4 is connected to the first end of the storage capacitor Cst, the second electrode of the compensation transistor T3, and the gate electrode of the driving transistor T1. The first and second electrodes of the initialization transistor T4 are different electrodes from the gate electrode of the initialization transistor T4.

The initialization transistor T4 is turned on according to the initialization signal GI[i] transmitted through the initialization line for transmitting the initialization signal GI[i] and then transmits the initialization voltage VINT to the gate electrode of the driving transistor T1 such that a voltage of the gate electrode of the driving transistor T1 may be initialized.

A gate electrode of the operation control transistor T5 is connected to the light emission control line for transmitting the light emission control signal EM[i], a first electrode of the operation control transistor T5 is connected to the power line for transmitting the first power voltage ELVDD, and a second electrode of the operation control transistor T5 is connected to the first electrode of the driving transistor T1 and the second electrode of the switching transistor T2. The first and second electrodes of the operation control transistor T5 are different electrodes from the gate electrode of the operation control transistor T5.

A gate electrode of the light emission control transistor T6 is connected to the light emission control line, a first electrode of the light emission control transistor T6 is connected to the second electrode of the driving transistor T1 and the first electrode of the compensation transistor T3, and a second electrode of the light emission control transistor T6 is electrically connected to the anode N1 of the organic light emitting diode OLED and a first electrode of the reset transistor T7. The first and second electrodes of the light emission control transistor T6 are different electrodes from the gate electrode of the light emission control transistor T6.

The operation control transistor T5 and the light emission control transistor T6 are simultaneously turned on depending on the light emission control signal EM[i] transmitted through the light emission control line, and in this case, the first power voltage ELVDD is transmitted to the organic light emitting diode OLED such that a driving current flows through the organic light emitting diode OLED.

A gate electrode of the reset transistor T7 is connected to the scan line, a second electrode of the reset transistor T7 is connected to the initialization voltage line for transmitting the initialization voltage VINT and the second electrode of the initialization transistor T4, and the first electrode of the reset transistor T7 is electrically connected to the anode N1 of the organic light emitting diode OLED and the second electrode of the light emission control transistor T6. The first and second electrodes of the reset transistor T7 are different electrodes from the gate electrode of the reset transistor T7.

The reset transistor T7 is simultaneously turned on with the switching transistor T2 according to the scan signal GW[i] transmitted through the scan line and then initializes a voltage of the anode N1 of the organic light emitting diode OLED with the initialization voltage VINT.

The second end of the storage capacitor Cst is connected to the power line for transmitting the first power voltage ELVDD, and a cathode of the organic light emitting diode OLED is connected to the power voltage ELVSS. Accordingly, the organic light emitting diode OLED receives the driving current from the driving transistor T1 to emit light, thus the organic light emitting diode display device 10 displays an image.

One pixel P of the display panel 100 includes at least two different types of transistors.

The driving transistor T1, the operation control transistor T5, and the light emission control transistor T6 among the transistors T1 to T7 included in one pixel P may be p-type transistors. A gate-on voltage for turning on the p-type transistor is a low-level voltage, and a gate-off voltage for turning it off is a high-level voltage.

The switching transistor T2, the compensation transistor T3, the initialization transistor T4, and the reset transistor T7 among the transistors T1 to T7 may be n-type transistors. A gate-on voltage for turning on the n-type transistor is a high-level voltage, and a gate-off voltage for turning it off is a low-level voltage.

The driving transistor T1, the operation control transistor T5, and the light emission control transistor T6 may be LTPS transistors ("LTPS TFTs") having a polysilicon semiconductor layer. The switching transistor T2, the compensation transistor T3, the initialization transistor T4, and the reset transistor T7 may be oxide semiconductors ("oxide TFTs") having an oxide semiconductor layer. In exemplary embodiments, the oxide semiconductor layer of the oxide transistor may be made of various metal oxides.

In an exemplary embodiment, the oxide semiconductor layer may include an oxide based on titanium (Ti), hafnium (Hf), zirconium (Zr), aluminum (Al), tantalum (Ta), germanium (Ge), zinc (Zn), gallium (Ga), tin (Sn), or indium (In), and complex oxides thereof such as zinc oxide (ZnO), indium-gallium-zinc oxide (In—Ga—Zn—O), indium-zinc oxide (In—Zn—O), zinc-tin oxide (Zn—Sn—O) indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), and hafnium-indium-zinc oxide (Hf—In—Zn—O).

A driving method of the organic light emitting diode display device 10 including the pixel P shown in FIG. 2 will now be described with reference to FIG. 3.

Figure 3:
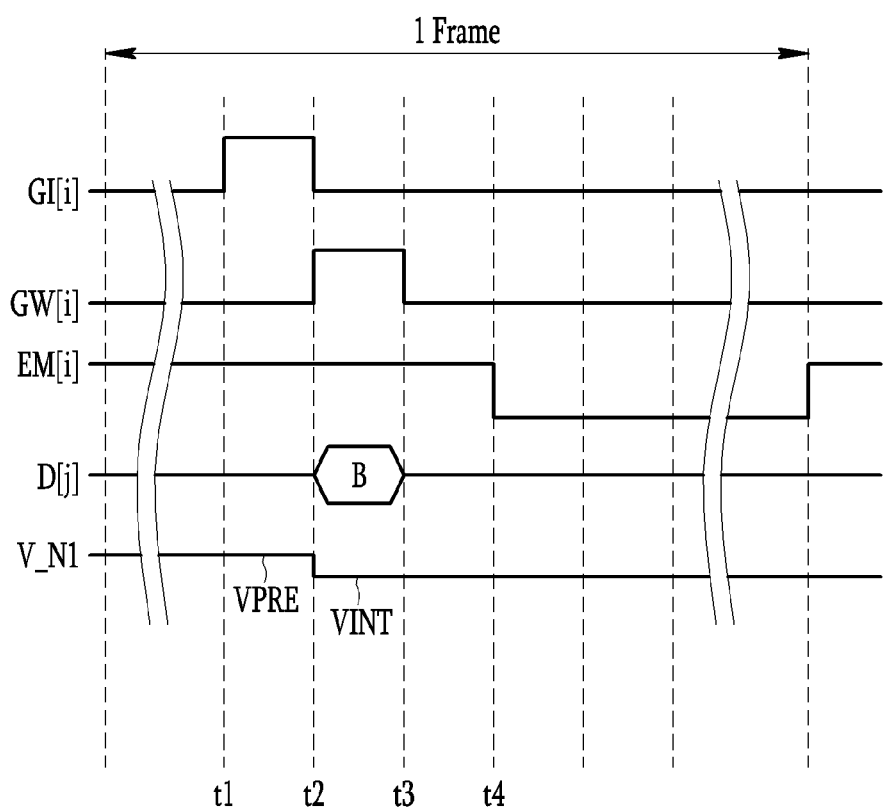
FIG. 3 illustrates a timing chart of an exemplary embodiment of a driving method of an organic light emitting diode display device in one frame.

FIG. 3 illustrates a timing chart of an exemplary embodiment of a driving method of an organic light emitting diode display device in one frame according to the invention.

At a first time t1 within a period (1 Frame) which is a duration that an image of one frame is displayed, the initialization signal GI[i] applied to an i-th row initialization line is changed from a low level voltage to a high level voltage.

The initialization transistor T4 is turned on by the high level voltage of the initialization signal GI[i]. From the first time t1 to a second time t2 at which the high level voltage of the initialization signal GI[i] is changed to the low level voltage, the gate electrode of the driving transistor T1 is initialized with the initialization voltage VINT transmitted through the turned-on initialization transistor T4.

At the second time t2, the scan signal GW[i] applied to an i-th scan line is changed from the low level voltage to the high level voltage. In addition, the data signal D[j] is applied to a j-th column data line.

The switching transistor T2, the compensation transistor T3, and the reset transistor T7 are turned on by the high level voltage of the scan signal GW[i]. From the second time t2 to a third time t3 at which the scan signal GW[i] is changed from the high level voltage to the low level voltage, a voltage which amounts to a compensated voltage of the data signal D[j] by a threshold voltage of the driving transistor T1 through the turned-on switching transistor T2 and the turned-on compensation transistor T3 is applied to the gate electrode of the driving transistor T1 and is stored in the storage capacitor Cst. The compensation transistor T3 compensates the threshold voltage of the driving transistor T1.

In addition, from the second time t2 to a third time t3, a voltage V_N1 of the anode N1 of the organic light emitting diode OLED is changed from a remaining voltage VPRE which was a voltage of the anode N1 during a previous frame period to the initialization voltage VINT transmitted through the turned-on reset transistor T7.

Then, at a fourth time t4, the light emission control signal EM[i] applied to an i-th row light emission control line is changed from a high level voltage to a low level voltage.

The operation control transistor T5 and the light emission control transistor T6 are turned on by the low level voltage of the light emission control signal EM[i]. Thus, a driving current corresponding to a voltage difference between the voltage of the gate electrode of the driving transistor T1 and the first power voltage ELVDD is supplied to the organic light emitting diode OLED through the light emission control transistor T6.

When the reset transistor T7 is turned off at the third time t3, the anode N1 of the organic light emitting diode OLED becomes in a floating state. Accordingly, the light emission control signal EM[i] applied to the light emission control transistor T6 may affect the voltage V_N1 of the anode N1.

It is assumed that a black data signal of gray level 0 which represents a black image is applied to the pixel P. In this case, if the light emission control transistor T6 is an n-type transistor, the high level voltage of the emission control signal EM[i] should be applied to the gate electrode of the light emission control transistor T6 in order to turn on the light emission control transistor T6. When the high level voltage of light emission control signal EM[i] is applied to the gate electrode of the light emission control transistor T6, the voltage V_N1 of the anode N1 in the floating state increases. A current may flow through the organic light emitting diode OLED due to the increased voltage V_N1 of the anode N1. Therefore, if the light emission control transistor T6 is the n-type transistor, the black image may not be accurately displayed due to the current flowing through the organic light emitting diode OLED.

However, in the organic light emitting diode display device 10 according to the invention, since the light emission control transistor T6 is the p-type transistor, the low level voltage of the light emission control signal EM[i] applied to the gate electrode of the light emission control transistor T6 can turn on the light emission control transistor T6. In the case of displaying the black image, since the low level voltage of the light emission control signal EM[i] is applied to the gate electrode of the light emission control transistor T6, the voltage V_N1 of the anode N1 in the floating state decreases. Since the current is prevented from flowing through the organic light emitting diode OLED due to the decreased voltage V_N1 of the anode N1, the organic light emitting diode display device 10 according to the invention may accurately display the black image.

Hereinafter, another exemplary embodiment of an organic light emitting diode display device according to the invention will be described with reference to FIG. 4 to FIG. 6.

Figure 4:
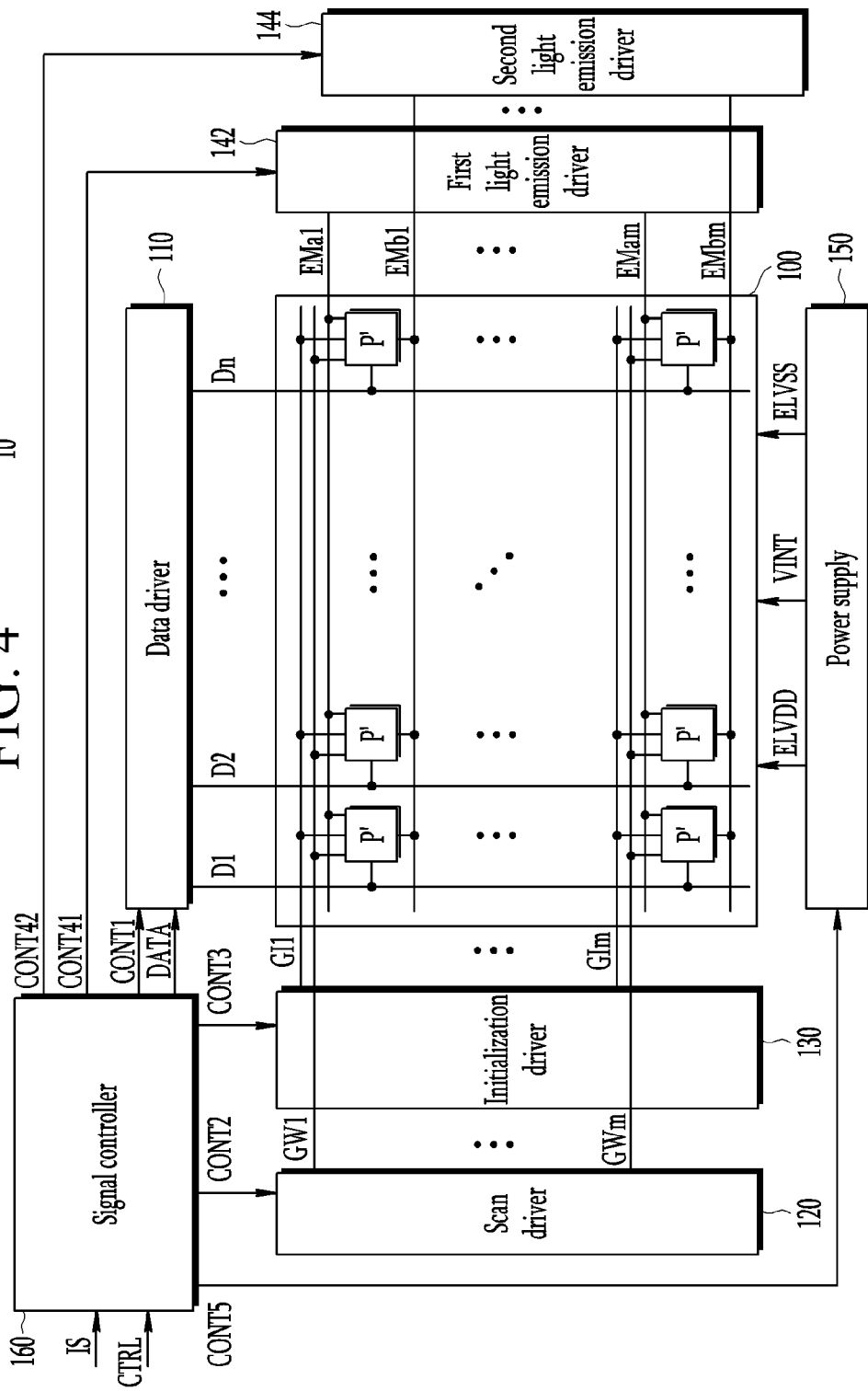
FIG. 4 illustrates a block diagram of another exemplary embodiment of an organic light emitting diode display device.

FIG. 4 illustrates a block diagram of another exemplary embodiment of an organic light emitting diode display device according to the invention. Among elements shown in FIG. 4, a detailed description for the same elements as those shown in FIG. 1 will be omitted. An organic light emitting diode display device 10' includes the display panel 100, the data driver 110, the scan driver 120, the initialization driver 130, a first light emission driver 142, a second light emission driver 144, the power supply 150, and the signal controller 160.

The display panel 100 includes a plurality of display signal lines and a plurality of pixels P' connected to the plurality of display signal lines. The plurality of display signal lines include a plurality of scan lines GW1 to GWm for transmitting a plurality of scan signals, which are also referred to as gate signals, a plurality of initialization lines GI1 to GIm for transmitting a plurality of initialization signals, a first plurality of light emission control lines EMa1 to EMam for transmitting a plurality of first light emission control signals, a second plurality of light emission control lines EMb1 to EMbm for transmitting a plurality of second light emission control signals, and a plurality of data lines D1 to Dn for transmitting a plurality of data voltages.

The first light emission driver 142 generates the plurality of first light emission control signals depending on a light emission control signal CONT41. The first light emission driver 142 transmits the plurality of first light emission control signals to the first light emission control lines EMa1 to EMam, respectively.

The second light emission driver 144 generates the plurality of second light emission control signals depending on a light emission control signal CONT42. The second light emission driver 144 transmits the plurality of second light emission control signals to the second light emission control lines EMb1 to EMbm, respectively.

An exemplary embodiment of a pixel P' of the organic light emitting diode display device 10' according to the invention will now be described in detail with reference to FIG. 5.

Figure 5:
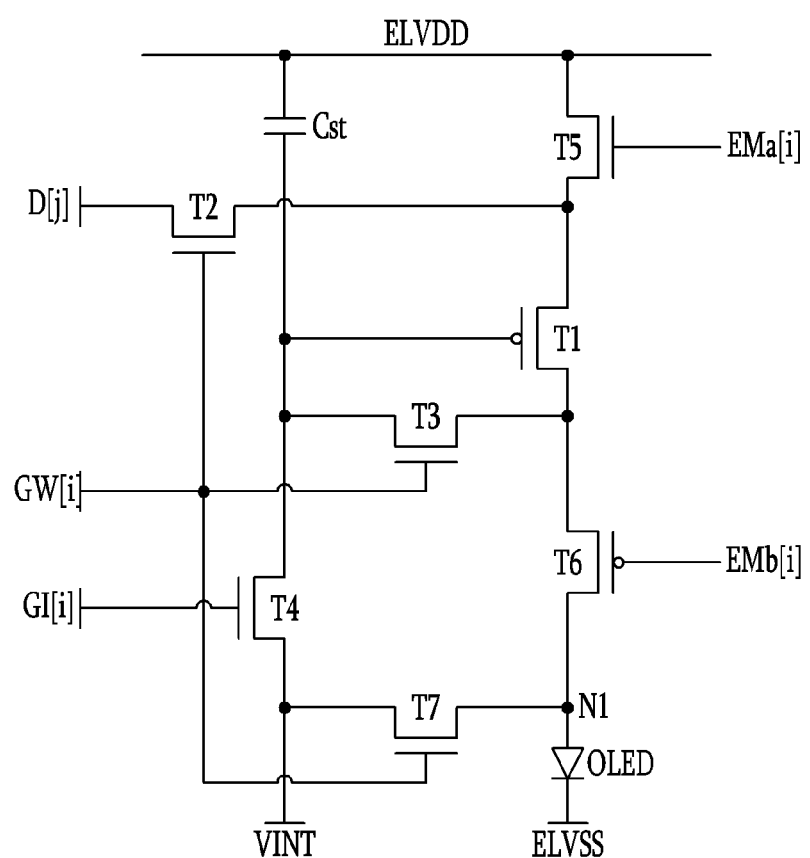
FIG. 5 illustrates a circuit diagram of another exemplary embodiment of a pixel of an organic light emitting diode display device.

FIG. 5 illustrates a circuit diagram of another exemplary embodiment of a pixel of an organic light emitting diode display device according to the invention. As shown in FIG. 5, an exemplary embodiment of one pixel of the organic light emitting diode display device 10' according to the invention includes a plurality of transistors T1 to T7, a storage capacitor Cst, and an organic light emitting diode OLED. Among elements shown in FIG. 5, a detailed description for the same elements as those shown in FIG. 2 will be omitted.

The signal lines connected to each pixel may include a scan line for transmitting a scan signal GW[i], an initialization line for transmitting an initialization signal GI[i] to the initialization transistor T4, a first light emission control line for transmitting a first light emission control signal EMa[i] to the operation control transistor T5, a second light emission control line for transmitting a second light emission control signal EMb[i] to the light emission control transistor T6, a data line for transmitting a data signal D[j], a power line for transmitting the first power voltage ELVDD, and an initialization voltage line for transmitting the initialization voltage VINT that initializes the driving transistor T1 and the organic light emitting diode OLED.

The gate electrode of the operation control transistor T5 is connected to the first light emission control line for transmitting the first light emission control signal EMa[i], the first electrode of the operation control transistor T5 is connected to the power line, and the second electrode of the operation control transistor T5 is connected to the first electrode of the driving transistor T1 and the second electrode of the switching transistor T2.

The gate electrode of the light emission control transistor T6 is connected to the second light emission control line for transmitting the second light emission control signal EMb[i], the first electrode of the light emission control transistor T6 is connected to the second electrode of the driving transistor T1 and the first electrode of the compensation transistor T3, and the second electrode of the light emission control transistor T6 is connected to the anode N1 of the organic light emitting diode OLED and the first electrode of the reset transistor T7.

The operation control transistor T5 and the light emission control transistor T6 are simultaneously turned on depending on the first light emission control signal EMa[i] transmitted through the first light emission control line and the second light emission control signal EMb[i] transmitted through the second light emission control line, and in this case, the first power voltage ELVDD is transmitted to the organic light emitting diode OLED such that a driving current flows through the organic light emitting diode OLED.

The driving transistor T1 and the light emission control transistor T6 among the transistors T1 to T7 included in one pixel P' may be p-type transistors.

The switching transistor T2, the compensation transistor T3, the initialization transistor T4, the operation control transistor T5, and the reset transistor T7 among the transistors T1 to T7 may be n-type transistors.

In addition, the driving transistor T1 and the light emission control transistor T6 may be LTPS transistors ("LTPS TFTs") having a polysilicon semiconductor layer.

The switching transistor T2, the compensation transistor T3, the initialization transistor T4, the operation control transistor T5, and the reset transistor T7 may be oxide semiconductors ("oxide TFTs") having an oxide semiconductor layer.

A driving method of the organic light emitting diode display device 10' including the pixel P' shown in FIG. 5 will be described with reference to FIG. 6.

Figure 6:
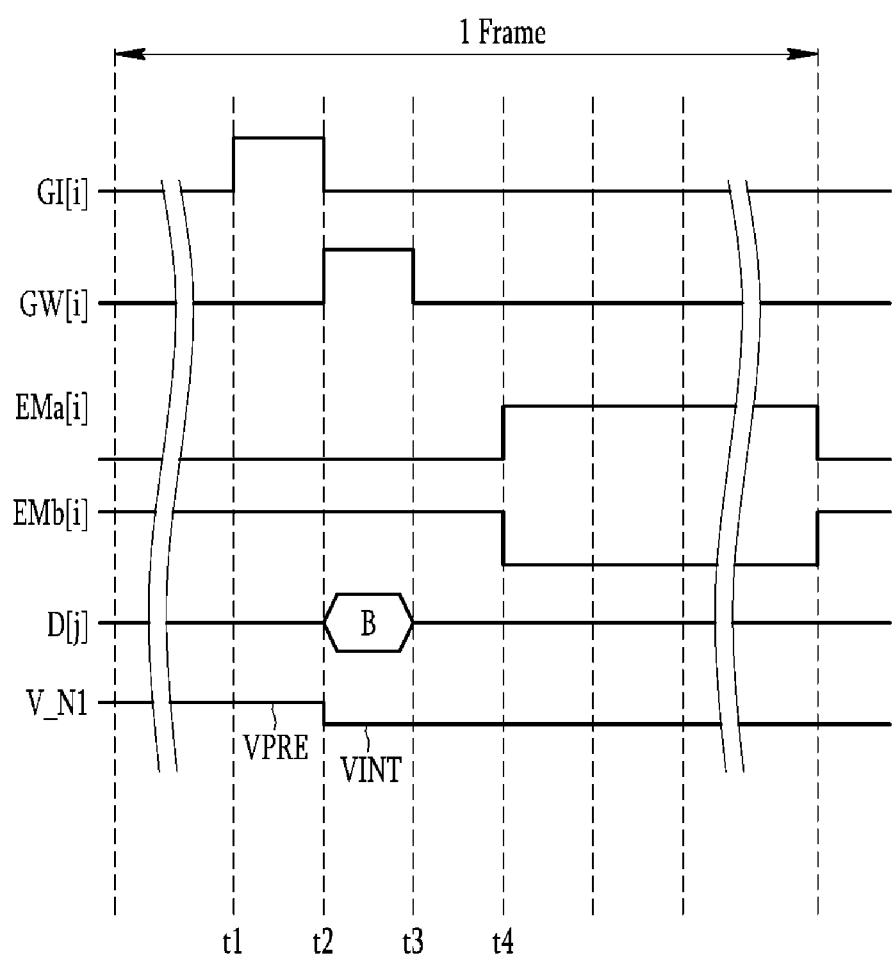
FIG. 6 illustrates a timing chart of another exemplary embodiment of a driving method of an organic light emitting diode display device in one frame.

FIG. 6 illustrates a timing chart of another exemplary embodiment of a driving method of an organic light emitting diode display device in one frame according to the invention.

At a first time t1 within a period (1 Frame) which is a duration that an image of one frame is displayed, the initialization signal GI[i] applied to an i-th row initialization line is changed from a low level voltage to a high level voltage.

The initialization transistor T4 is turned on by the high level voltage of the initialization signal GI[i]. From the first time t1 to a second time t2 at which the high level voltage of the initialization signal GI[i] is changed to the low level voltage, the gate electrode of the driving transistor T1 is initialized with the initialization voltage VINT transmitted through the turned-on initialization transistor T4.

At the second time t2, the scan signal GW[i] applied to an i-th scan line is changed from the low level voltage to the high level voltage. In addition, the data signal D[j] is applied to a j-th column data line.

The switching transistor T2, the compensation transistor T3, and the reset transistor T7 are turned on by the high level voltage of the scan signal GW[i]. From the second time t2 to a third time t3 at which the scan signal GW[i] is changed from the high level voltage to the low level voltage, a voltage which amounts to a compensated voltage of the data signal D[j] by a threshold voltage of the driving transistor T1 through the turned-on switching transistor T2 and the turned-on compensation transistor T3 is applied to the gate electrode of the driving transistor T1 and is stored in the storage capacitor Cst.

In addition, from the second time t2 to a third time t3, a voltage V_N1 of the anode N1 of the organic light emitting diode OLED is changed from a remaining voltage VPRE which was a voltage of the anode N1 during a previous frame period to the initialization voltage VINT transmitted through the turned-on reset transistor T7.

Then, at a fourth time t4, the first light emission control signal EMa[i] applied to an i-th row first light emission control line is changed from a low level voltage to a high level voltage, and the second light emission control signal EMb[i] applied to an i-th row second light emission control line is changed from the high level voltage to the low level voltage.

The operation control transistor T5 is turned on by the high level voltage of the first light emission control signal EMa[i].

In addition, the light emission control transistor T6 is turned on by the low level voltage of the second light emission control signal EMb[i]. Thus, a driving current corresponding to a voltage difference between the voltage of the gate electrode of the driving transistor T1 and the first power voltage ELVDD is supplied to the organic light emitting diode OLED through the light emission control transistor T6.

When the reset transistor T7 is turned off at the third time t3, the anode N1 of the organic light emitting diode OLED becomes in a floating state. Accordingly, the light emission control signal EM[i] applied to the light emission control transistor T6 may affect the voltage V_N1 of the anode N1.

It is assumed that a black data signal of gray level 0 which represents a black image is applied to the pixel P'. In this case, if the light emission control transistor T6 is an n-type transistor, the high level voltage of the emission control signal EM[i] should be applied to the gate electrode of the light emission control transistor T6 in order to turn on the light emission control transistor T6. When the high level voltage of the light emission control signal EM[i] is applied to the gate electrode of the light emission control transistor T6, the voltage V_N1 of the anode N1 in the floating state increases. A current may flow through the organic light emitting diode OLED due to the increased voltage V_N1 of the anode N1. Therefore, if the light emission control transistor T6 is the n-type transistor, the black image may not be accurately displayed due to the current flowing through the organic light emitting diode OLED.

However, in the organic light emitting diode display device 10' according to the invention, since the light emission control transistor T6 is the p-type transistor, the low level voltage of the light emission control signal EM[i] applied to the gate electrode of the light emission control transistor T6 can turn on the light emission control transistor T6. In the case of displaying the black image, since the low level voltage of the light emission control signal EM[i] is applied to the gate electrode of the light emission control transistor T6, the voltage V_N1 of the anode N1 of the floating state decreases. Since the current is prevented from flowing through the organic light emitting diode OLED due to the decreased voltage V_N1 of the anode N1, the organic light emitting diode display device 10' according to invention may accurately display the black image. In addition, since the operation control transistor T5 is an oxide semiconductor transistor having a low turn-off current, it is possible to reduce power consumption of an organic light emitting diode display device.

While the invention has been described in connection with what is presently considered to be practical exemplary embodiments, it is to be understood that the invention is not limited to the disclosed exemplary embodiments, but, on the contrary, is intended to cover various modifications and equivalent arrangements included within the spirit and scope of the appended claims.

What is claimed is:

1. An organic light emitting diode display device comprising:
    a plurality of pixels;
    a plurality of scan lines connected to the plurality of pixels and which transmits corresponding scan signals to the plurality of pixels;
    a plurality of initialization lines connected to the plurality of pixels and which transmits corresponding initialization signals to the plurality of pixels;
    a plurality of light emission control lines connected to the plurality of pixels and which transmits corresponding light emission control signals to the plurality of pixels; and
    a plurality of data lines connected to the plurality of pixels and which transmits corresponding data signals to the plurality of pixels,
    wherein at least one of the plurality of pixels includes
    a switching transistor turned on by a scan signal received from a corresponding one of the plurality of scan lines and which transmits a data signal received from a corresponding one of the plurality of data lines to a first node,
    a driving transistor connected between the first node and a second node and through which a driving current corresponding to the data signal flows,
    a storage capacitor which includes a first end connected to a power supply and a second end connected to a gate electrode of the driving transistor,
    an organic light emitting diode which emits light based on the driving current, wherein the driving current flows through the organic light emitting diode,
    a light emission control transistor connected between the second node and an anode of the organic light emitting diode and which is turned on by an light emission control signal received from a corresponding one of the plurality of light emission control lines and which transmits the driving current to the organic light emitting diode,
    an initialization transistor turned on by an initialization signal received from a corresponding one of the plurality of initialization lines and which applies an initialization voltage to the gate electrode of the driving transistor; and
    a reset transistor turned on by the scan signal and which applies the initialization voltage directly to the anode of the organic light emitting diode,
    wherein the switching transistor is an n-type transistor, and the light emission control transistor is a p-type transistor.

2. The organic light emitting diode display device of claim 1, wherein
    the light emission control transistor is a low-temperature polycrystalline silicon (LTPS) semiconductor transistor, and the switching transistor is an oxide semiconductor transistor.

3. The organic light emitting diode display device of claim 2, further comprising
    a compensation transistor which compensates a threshold voltage of the driving transistor and is connected to the driving transistor.

4. The organic light emitting diode display device of claim 1, wherein
    the compensation transistor, the initialization transistor, and the reset transistor are n-type transistors.

5. The organic light emitting diode display device of claim 4, wherein the compensation transistor, the initialization transistor, and the reset transistor are oxide semiconductor transistors.

6. The organic light emitting diode display device of claim 1, further comprising
an operation control transistor turned on by the light emission control signal and which connects the first node and the power supply.

7. The organic light emitting diode display device of claim 6, wherein
the operation control transistor is a p-type transistor.

8. The organic light emitting diode display device of claim 6, wherein
the operation control transistor is an n-type transistor.

9. An organic light emitting diode display device comprising:
a plurality of pixels;
a plurality of scan lines connected to the plurality of pixels and which transmits corresponding scan signals to the plurality of pixels;
a plurality of initialization lines connected to the plurality of pixels and which transmits corresponding initialization signals to the plurality of pixels;
a plurality of light emission control lines connected to the plurality of pixels and which transmits corresponding light emission control signals to the plurality of pixels; and
a plurality of data lines connected to the plurality of pixels and which transmits corresponding data signals to the plurality of pixels,
wherein at least one of the plurality of pixels includes
a switching transistor turned on by a scan signal received from a corresponding one of the plurality of scan lines and which transmits a data signal received from a corresponding one of the plurality of data lines to a first node,
a driving transistor connected between the first node and a second node and through which a driving current corresponding to the data signal flows,
a storage capacitor which includes a first end connected to a power supply and a second end connected to a gate electrode of the driving transistor,
an organic light emitting diode which emits light by the driving current, wherein the driving current flowing through the organic light emitting diode,
a light emission control transistor connected between the second node and an anode of the organic light emitting diode and which is turned on by an light emission control signal received from a corresponding one of the plurality of light emission control lines and which transmits the driving current to the organic light emitting diode,
an initialization transistor turned on by an initialization signal received from a corresponding one of the plurality of initialization lines and which applies an initialization voltage to the gate electrode of the driving transistor; and
a reset transistor turned on by the scan signal and which applies the initialization voltage directly to the anode of the organic light emitting diode,
wherein the at least one of the plurality of pixels includes both an n-type transistor provided with an oxide semiconductor layer and a p-type transistor provided with a low-temperature polycrystalline silicon (LTPS) semiconductor layer.

10. The organic light emitting diode display device of claim 9, wherein
the switching transistor is the n-type transistor provided with the oxide semiconductor layer, and the driving transistor and the light emission control transistor are the p-type transistors provided with the LTPS semiconductor layer.

11. The organic light emitting diode display device of claim 9, further comprising:
a compensation transistor which compensates a threshold voltage of the driving transistor and is connected to the driving transistor.

12. The organic light emitting diode display device of claim 11, wherein
the compensation transistor, the initialization transistor, and the reset transistor are the n-type transistors provided with the oxide semiconductor layer.

13. The organic light emitting diode display device of claim 9, further comprising
an operation control transistor turned on by the light emission control signal and which connects the first node and the power supply.

14. The organic light emitting diode display device of claim 13, wherein
the operation control transistor is the p-type transistor provided with the LTPS semiconductor layer.

15. The organic light emitting diode display device of claim 13, wherein
the operation control transistor is the n-type transistor provided with the oxide semiconductor layer.

* * * * *